United States Patent
Lieberman

(10) Patent No.: US 11,845,889 B2
(45) Date of Patent: Dec. 19, 2023

(54) NANOPARTICLE

(71) Applicant: Merck Patent GmbH, Darmstadt (DE)

(72) Inventor: Itai Lieberman, Dreieich (DE)

(73) Assignee: Merck Patent GmbH, Darmstadt (DE)

( * ) Notice: Subject to any disclaimer, the term of this patent is extended or adjusted under 35 U.S.C. 154(b) by 82 days.

(21) Appl. No.: 17/285,242

(22) PCT Filed: Oct. 11, 2019

(86) PCT No.: PCT/EP2019/077586
§ 371 (c)(1),
(2) Date: Apr. 14, 2021

(87) PCT Pub. No.: WO2020/078843
PCT Pub. Date: Apr. 23, 2020

(65) Prior Publication Data
US 2021/0380882 A1    Dec. 9, 2021

(30) Foreign Application Priority Data

Oct. 15, 2018 (EP) .................................... 18200551

(51) Int. Cl.
| | |
|---|---|
| *C09K 11/02* | (2006.01) |
| *C09K 11/70* | (2006.01) |
| *C09K 11/56* | (2006.01) |
| *C09K 11/88* | (2006.01) |
| *B82Y 20/00* | (2011.01) |
| *B82Y 30/00* | (2011.01) |
| *B82Y 40/00* | (2011.01) |
| *H10K 50/115* | (2023.01) |

(52) U.S. Cl.
CPC ............ *C09K 11/70* (2013.01); *C09K 11/025* (2013.01); *C09K 11/565* (2013.01); *C09K 11/883* (2013.01); *B82Y 20/00* (2013.01); *B82Y 30/00* (2013.01); *B82Y 40/00* (2013.01); *H10K 50/115* (2023.02)

(58) Field of Classification Search
CPC .............................. C09K 11/025; C09K 11/70
See application file for complete search history.

(56) References Cited

U.S. PATENT DOCUMENTS

| | | | |
|---|---|---|---|
| 9,666,768 B2 | 5/2017 | Daniels et al. | |
| 2011/0006281 A1* | 1/2011 | Jang .................. | H01L 51/5072 252/500 |
| 2016/0289552 A1 | 10/2016 | Werner et al. | |

(Continued)

FOREIGN PATENT DOCUMENTS

| | | |
|---|---|---|
| CN | 106367060 A | 2/2017 |
| CN | 108624320 A | 10/2018 |

(Continued)

OTHER PUBLICATIONS

Yoon et al., Colloids and Surfaces A: Physicochem. Eng. Aspects, 2013, 428, 86-91.

(Continued)

*Primary Examiner* — Matthew E. Hoban
(74) *Attorney, Agent, or Firm* — MILLEN WHITE ZELANO AND BRANIGAN, PC; Csaba Henter

(57) ABSTRACT

The present invention relates to a nanoparticle and a composition comprising a nanoparticle.

20 Claims, 1 Drawing Sheet

(56) References Cited

U.S. PATENT DOCUMENTS

2018/0186998 A1* 7/2018 Ahn ................. C09K 11/08

FOREIGN PATENT DOCUMENTS

| JP | 2017137451 A | 8/2017 |
|----|--------------|--------|
| KR | 20180106126 A | 10/2018 |

OTHER PUBLICATIONS

International Search Report PCT/EP2019/077586 dated Jan. 21, 2020 (pp. 1-4).
First Office Action in corresponding JP Appln. No. 2021-545320 dated May 19, 2023 (pp. 1-3) and english translation thereof (pp. 1-2).

* cited by examiner

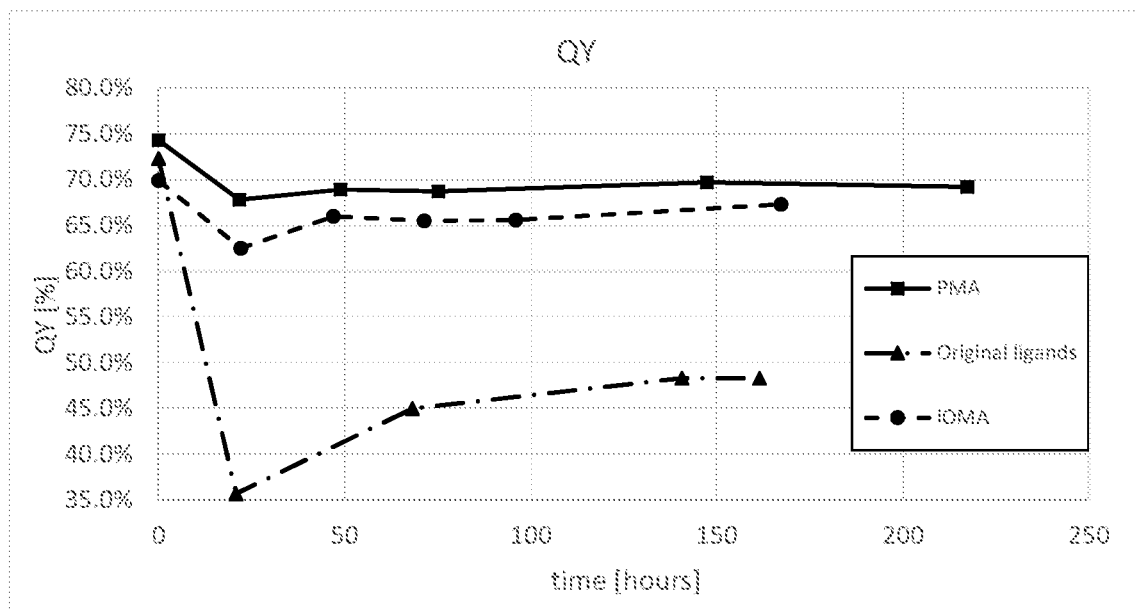

NANOPARTICLE

FIELD OF THE INVENTION

The present invention relates to a semiconducting light emitting nanoparticle, composition comprising a semiconducting light emitting nanoparticle, formulation, use of a semiconducting light emitting nanoparticle, use of a composition, use of a formulation, an optical medium, and an optical device.

BACKGROUND ART

US 2010/0068522 A1 discloses quantum dot nanoparticles with a surface binding ligand having a carboxylate group as a bonding group and a vinyl group as the suitable terminal unsaturated group of the functional group.

U.S. Pat. No. 9,666,768 B2 mentions using dithio-ligands represented by chemical formulae (1) to (6) as suitable ligands for a quantum dot nanoparticle.

PATENT LITERATURE

1. US 2016-0289552 A1
2. U.S. Pat. No. 9,666,768 B2

NON-PATENT LITERATURE

No

SUMMARY OF THE INVENTION

However, the inventors newly have found that there is still one or more of considerable problems for which improvement is desired, as listed below;

improvement of quantum yield of nanoparticle, higher device efficiency, lowering trap emission of nanoparticle, optimizing a surface condition of shell part of nanoparticle, reducing lattice defects of a shell layer of nanoparticle, reducing/preventing formation of dangling bonds of shell layer, better thermal stability, improved oxidation stability, improved stability to a radical substances, improved stability during a long term storage without causing a significant QY drop, better chemical stability, optimizing fabrication process of nanoparticle, providing new fabrication process for reducing lattice defects of a shell layer, environmentally more friendly and safer fabrication process.

The inventors aimed to solve one or more of the above-mentioned problems.

Then it was found a novel semiconducting light emitting nanoparticle comprising, essentially consisting of, or consisting of, at least
  i) a first semiconducting material;
  ii) optionally at least one shell layer;
  iii) a chemical compound represented by following chemical formula (I)

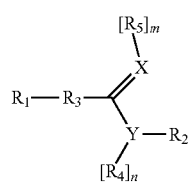

(I)

wherein
  X and Y are each independently or dependently of each other, O, S, P or N, preferably O or S;
  n is 0 if Y is O or S, n is 1 if Y is N or P, preferably n is 0;
  m is 0 if X is O or S, m is 1 if Y is N or P, preferably n is 0;
  $R_1$ is an attaching group, preferably said attaching group comprises at least one element selected from S, Se, O, P or N, more preferably a group containing sulfur or selenium, even more preferably said attaching group comprises one or two S atoms, even more preferably said attaching group is

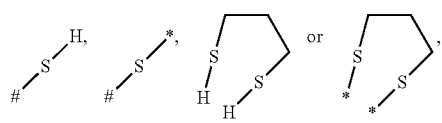

furthermore preferably

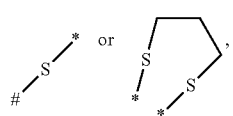

where "#" represents the connecting point to group Y, and "*" represents the connecting point to the surface of the first semiconducting material or the outermost surface of the shell layer of the semiconducting light emitting nanoparticle;

In case of the nanoparticle comprises more than two shell layers, "*" represents the connecting point to the outermost surface of the shell layers of the semiconducting light emitting nanoparticle.

$R_2$ is selected from one or more member of the group consisting of a linear alkyl group or alkoxyl group having 1 to 40 carbon atoms, preferably 1 to 25 carbon atoms, more preferably 1 to 15 carbon atoms, a branched alkyl group or alkoxyl group having 3 to 40 carbon atoms, preferably 3 to 25 carbon atoms, more preferably 3 to 15 carbon atoms, a cycloalkane group having 3 to 40 carbon atoms, preferably 3 to 25 carbon atoms, more preferably 3 to 15 carbon atoms, an alkenyl group having 2 to 40 carbon atoms, preferably 2 to 25 carbon atoms, an aryl group having 3 to 40 carbon atoms, preferably 3 to 25 carbon atoms, a hetero aryl group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C=C$, $Si(R^a)_2$, $Ge(R^a)_2$, $Sn(R^a)_2$, $C=O$, $C=S$, $C=NR^a$, SO, $SO_2$, $NR^a$, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, $R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;

$R_3$ is a divalent bond, preferably it is selected from one or more member of the group consisting of a linear alkylene group or alkoxylene group having 1 to 25 carbon atoms, preferably 1 to 15 carbon atoms, more preferably 1 to 10 carbon atoms, even more preferably 1 to 5 carbon atoms, where one or more non-adjacent $CH_2$ groups may be replaced by $R^aC=CR^a$, $C=C$, $Si(R^a)_2$, $Ge(R^a)_2$, $Sn(R^a)_2$, $C=O$, $C=S$, $C=NR^a$, $SO$, $SO_2$, $NR^a$, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, preferably none of non-adjacent $CH_2$ groups are substituted, $R_4$ is selected from one or more member of the group consisting of H atom, D atom, or $R_2$, $R_5$ is selected from one or more member of the group consisting of H atom, D atom, or $R_2$.

In another aspect, the present invention also relates to a composition comprising at least a) one semiconducting light emitting nanoparticle comprising a core, optionally at least one shell layer,
b) one chemical compound represented by following chemical formula (I)

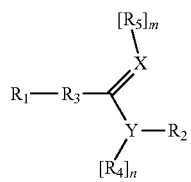

(I)

wherein

X and Y are each independently or dependently of each other, O, S, P or N, preferably O or N;

n is 0 if Y is O or S, n is 1 if Y is N or P, preferably n is 0;

m is 0 if X is O or S, m is 1 if Y is N or P, preferably n is 0;

$R_1$ is an attaching group, preferably said attaching group comprises at least one element selected from S, Se, O, P or N, more preferably said attaching group comprises one or two S atoms, even more preferably said attaching group is

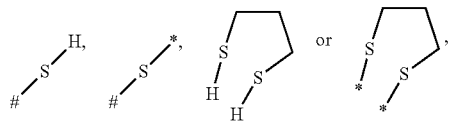

furthermore preferably

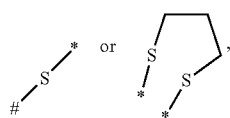

where "#" represents the connecting point to group Y, and "*" represents the connecting point to the surface of the first semiconducting material or the outermost surface of the shell layer of the semiconducting light emitting nanoparticle;

In case of the nanoparticle comprises more than two shell layers, "*" represents the connecting point to the outermost surface of the shell layers of the semiconducting light emitting nanoparticle.

$R_2$ is selected from one or more member of the group consisting of a linear alkyl group or alkoxyl group having 1 to 40 carbon atoms, preferably 1 to 25 carbon atoms, more preferably 1 to 15 carbon atoms, a branched alkyl group or alkoxyl group having 3 to 40 carbon atoms, preferably 3 to 25 carbon atoms, more preferably 3 to 15 carbon atoms, a cycloalkane group having 3 to 40 carbon atoms, preferably 3 to 25 carbon atoms, more preferably 3 to 15 carbon atoms, an alkenyl group having 2 to 40 carbon atoms, preferably 2 to 25 carbon atoms, an aryl group having 3 to 40 carbon atoms, preferably 3 to 25 carbon atoms, a hetero aryl group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C=C$, $Si(R^a)_2$, $Ge(R^a)_2$, $Sn(R^a)_2$, $C=O$, $C=S$, $C=NR^a$, $SO$, $SO_2$, $NR^a$, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, $R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;

$R_3$ is selected from one or more member of the group consisting of a linear alkylene group or alkoxylene group having 1 to 25 carbon atoms, preferably 1 to 15 carbon atoms, more preferably 1 to 10 carbon atoms, even more preferably 1 to 5 carbon atoms, where one or more non-adjacent $CH_2$ groups may be replaced by $R^aC=CR^a$, $C=C$, $Si(R^a)_2$, $Ge(R^a)_2$, $Sn(R^a)_2$, $C=O$, $C=S$, $C=NR^a$, $SO$, $SO_2$, $NR^a$, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, preferably none of non-adjacent $CH_2$ groups are substituted, $R_4$ is selected from one or more member of the group consisting of H atom, D atom, or $R_2$, $R_5$ is selected from one or more member of the group consisting of H atom, D atom, or $R_2$.

and c) another compound.

In another aspect, the present invention relates to composition comprising, essentially consisting of, or consisting of, at least A) one semiconducting light emitting nanoparticle according to the present invention, and
B) another compound In another aspect, the present invention further relates to a formulation comprising, essentially consisting of, or a consisting of, at least one semiconducting light emitting nanoparticle according to the present invention,
and
at least one solvent, preferably said solvent is an organic solvent, even more preferably cyclohexylbenzene, 3-phenoxy toluene, n-octyl benzene, butyl benzoate, 1-octanol, 3,4-dimethylanisole, 2-phenoxyethanol, methyl isovalerate, dimethyl sulfoxide, 2-phenoxypropanol or a combination of any of these.

In another aspect, the present invention also relates to use of the light emitting nanoparticle, the composition, or the formulation in an electronic device, optical device, in a biomedical device or for fabricating an electronic device, optical device or a biomedical device.

In another aspect, the present invention further relates to an optical medium comprising at least one light emitting nanoparticle or the composition of the present invention.

In another aspect, the present invention further relates to an optical device comprising at least said optical medium.

DESCRIPTION OF DRAWINGS

FIG. 1 shows the measurement results of working example 6.

DETAILED DESCRIPTION OF THE INVENTION

According to the present invention, semiconducting light emitting nanoparticle comprising at least
i) a first semiconducting material;
ii) optionally at least one shell layer;
iii) a chemical compound represented by following chemical formula (I)
Chemical Compound

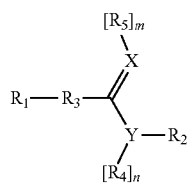

(I)

wherein
X and Y are each independently or dependently of each other, O, S, P or N, preferably O or S;
n is 0 if Y is O or S, n is 1 if Y is N or P, preferably n is 0;
m is 0 if X is O or S, m is 1 if Y is N or P, preferably n is 0;
$R_1$ is an attaching group, preferably said attaching group comprises at least one element selected from S, Se, O, P or N, more preferably a group containing sulfur or selenium, even more preferably said attaching group comprises one or two S atoms, even more preferably said attaching group is

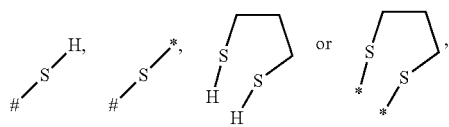

furthermore preferably

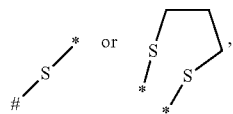

where "#" represents the connecting point to group Y, and "*" represents the connecting point to the surface of the first semiconducting material or the outermost surface of the shell layer of the semiconducting light emitting nanoparticle;

In case of the nanoparticle comprises more than two shell layers, "*" represents the connecting point to the outermost surface of the shell layers of the semiconducting light emitting nanoparticle.

$R_2$ is selected from one or more member of the group consisting of a linear alkyl group or alkoxyl group having 1 to 40 carbon atoms, preferably 1 to 25 carbon atoms, more preferably 1 to 15 carbon atoms, a branched alkyl group or alkoxyl group having 3 to 40 carbon atoms, preferably 3 to 25 carbon atoms, more preferably 3 to 15 carbon atoms, a cycloalkane group having 3 to 40 carbon atoms, preferably 3 to 25 carbon atoms, more preferably 3 to 15 carbon atoms, an alkenyl group having 2 to 40 carbon atoms, preferably 2 to 25 carbon atoms, an aryl group having 3 to 40 carbon atoms, preferably 3 to 25 carbon atoms, a hetero aryl group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C=C$, $Si(R^a)_2$, $Ge(R^a)_2$, $Sn(R^a)_2$, $C=O$, $C=S$, $C=NR^a$, SO, $SO_2$, $NR^a$, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, $R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;

$R_3$ is a divalent bond, preferably it is selected from one or more member of the group consisting of a linear alkylene group or alkoxylene group having 1 to 25 carbon atoms, preferably 1 to 15 carbon atoms, more preferably 1 to 10 carbon atoms, even more preferably 1 to 5 carbon atoms, where one or more non-adjacent $CH_2$ groups may be replaced by $R^aC=CR^a$, $C=C$, $Si(R^a)_2$, $Ge(R^a)_2$, $Sn(R^a)_2$, $C=O$, $C=S$, $C=NR^a$, SO, $SO_2$, $NR^a$, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, preferably none of non-adjacent $CH_2$ groups are substituted, $R_4$ is selected from one or more member of the group consisting of H atom, D atom, or $R_2$, $R_5$ is selected from one or more member of the group consisting of H atom, D atom, or $R_2$.

In some embodiments of the present invention, the surface of the core, or the outermost surface of one or more shell layers of the semiconducting light emitting nanoparticle can be partly or fully over coated by the chemical compound.

In some embodiments of the present invention, at least two ligands represented by chemical formula (I) are attached onto the surface of the first semiconducting material or the outermost surface of the shell layers, preferably a plurality of said ligands are attached onto the surface of the first semiconducting material or the outermost surface of the shell layers.

According to the present invention, in some embodiments, the content of said chemical compound is in the range from 1% to 80% by weight, more preferably in the range from 20% to 70% by weight, even more preferably from 40% to 65% by weight with respect to the total weight of the semiconducting light emitting nanoparticle.

In a preferred embodiment of the present invention, the weight average molecular weight (Mw) of the chemical compound is in the range from 200 g/mol to 30,000 g/mol, preferably from 250 g/mol to 2,000 g/mol, more preferably from 400 g/mol to 1,000 g/mol.

The molecular weight $M_w$ is determined by means of GPC (=gel permeation chromatography) against an internal polystyrene standard.

In a preferred embodiment, the chemical compound is represented by following formula (Ia), (Ib), (Ic) or (Id),

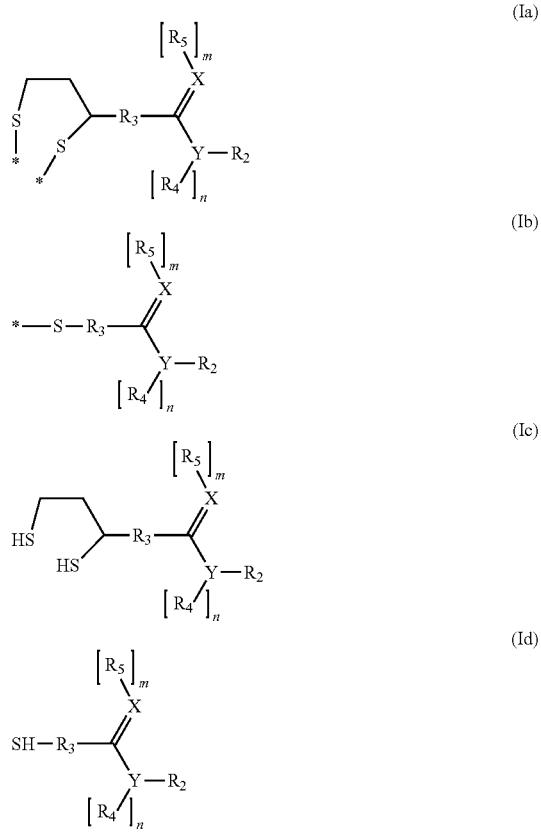

More preferably, the chemical compound is represented by following chemical formula (Ie), (If), (Ig) or (Ih),

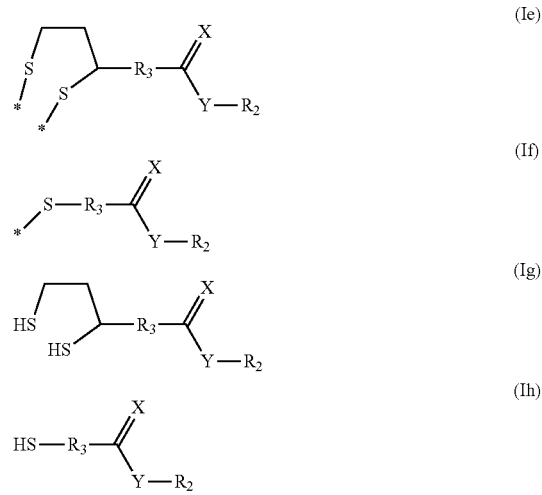

wherein

X and Y are each independently or dependently of each other, O or S, preferably it is O;

"*" represents the connecting point to the surface of the first semiconducting material or the outermost surface of the shell layer of the semiconducting light emitting nanoparticle;

In case of the nanoparticle comprises more than two shell layers, "*" represents the connecting point to the outermost surface of the shell layers of the semiconducting light emitting nanoparticle.

$R_2$ is selected from one or more member of the group consisting of a linear alkyl group or alkoxyl group having 1 to 40 carbon atoms, preferably 3 to 25 carbon atoms, more preferably 5 to 15 carbon atoms, a branched alkyl group or alkoxyl group having 3 to 40 carbon atoms, preferably 3 to 25 carbon atoms, more preferably 5 to 15 carbon atoms, a cycloalkane group having 3 to 40 carbon atoms, preferably 3 to 25 carbon atoms, more preferably 3 to 15 carbon atoms, an alkenyl group having 2 to 40 carbon atoms, preferably 2 to 25 carbon atoms, an aryl group having 3 to 40 carbon atoms, preferably 3 to 25 carbon atoms, a hetero aryl group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C=C$, $Si(R^a)_2$, $Ge(R^a)_2$, $Sn(R^a)_2$, $C=O$, $C=S$, $C=NR^a$, SO, $SO_2$, $NR^a$, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, $R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;

$R_3$ is a divalent bond, preferably it is selected from one or more member of the group consisting of a linear alkylene group or alkoxylene group having 1 to 25 carbon atoms, preferably 1 to 15 carbon atoms, more preferably 1 to 10 carbon atoms, even more preferably 1 to 5 carbon atoms, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=NR^a$, $SO$, $SO_2$, $NR^a$, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, preferably none of non-adjacent $CH_2$ groups are substituted, Preferably, $R_3$ is selected from the group of following table 1.

TABLE 1

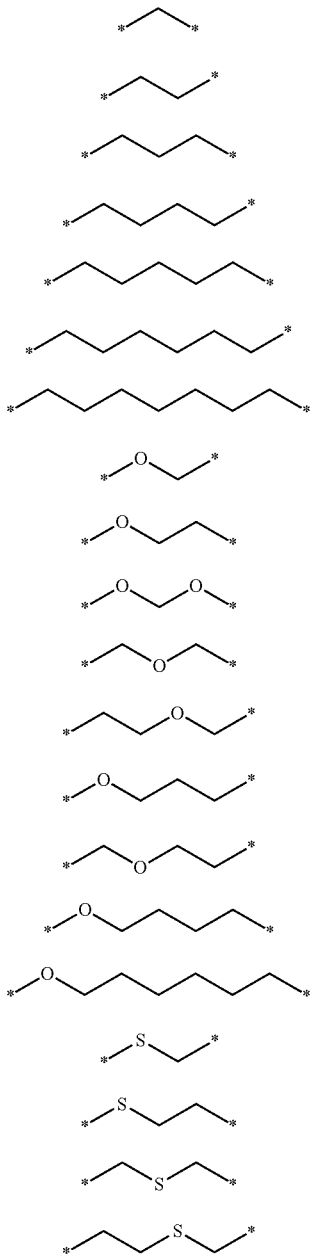

TABLE 1-continued

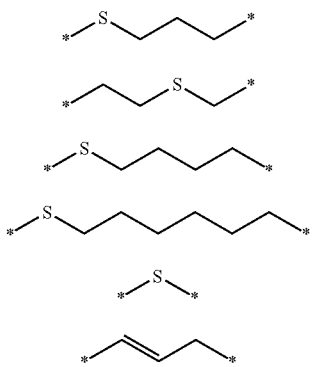

wherein and "*" represents the connecting point to another unit.

More preferably, $R_3$ is selected from the group of following table 2.

TABLE 2

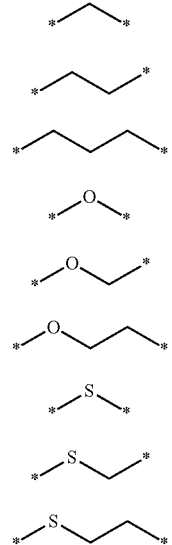

wherein and "*" represents the connecting point to another unit.

Preferably, $R_2$ is a substituted or non-substituted linear alkyl group or alkoxyl group having 1 to 40 carbon atoms, preferably 3 to 25 carbon atoms, more preferably 5 to 15 carbon atoms; a substituted or non-substituted branched alkyl group or alkoxyl group having 3 to 40 carbon atoms, preferably 3 to 25 carbon atoms, more preferably 5 to 15 carbon atoms; a substituted or non-substituted cycloalkane group having 3 to 40 carbon atoms, preferably 3 to 25 carbon atoms, more preferably 3 to 15 carbon atoms; a substituted or non-substituted aryl group having 3 to 40 carbon atoms, preferably 3 to 25 carbon atoms.

More preferably, $R_2$ is a substituted linear alkyl group having 1 to 40 carbon atoms, a non-substituted branched alkyl group or alkoxyl group having 3 to 40 carbon atoms, preferably 3 to 25 carbon atoms, more preferably 5 to 15 carbon atoms.

More preferably, $R_2$ is selected from the group of following table 3.

TABLE 3

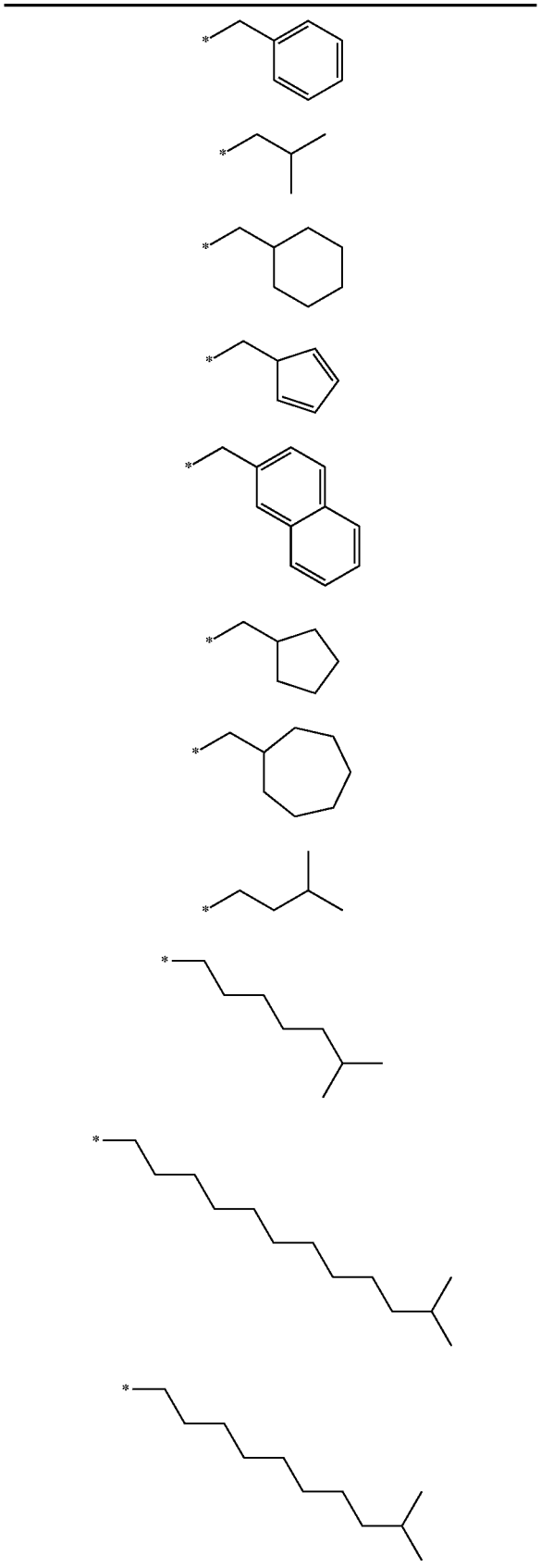

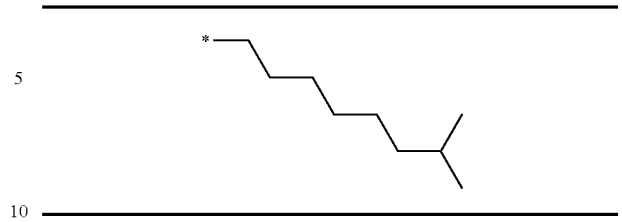

wherein and "*" represents the connecting point to another unit.

As the chemical compound, publicly available mercaptoacetates and/or mercaptopropionates are furthermore suitable as the chemical compound to prevent/reduce Quantum Yield drop of the semiconducting light emitting nanoparticle in a mixture, preferable in a solution, especially in the presence of a photo-initiators.

Publicly available following chemical compounds are especially suitable.

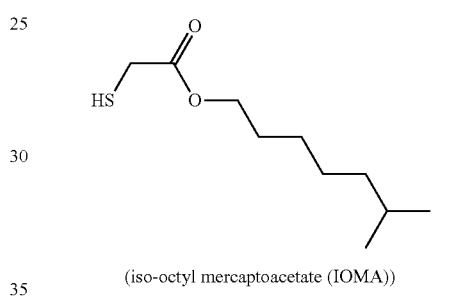

(iso-octyl mercaptoacetate (IOMA))

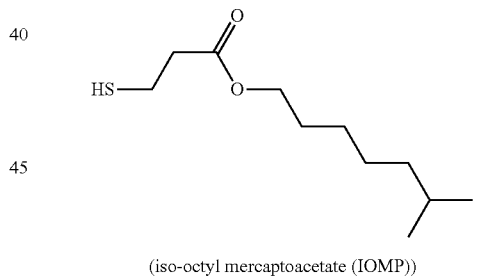

(iso-octyl mercaptoacetate (IOMP))

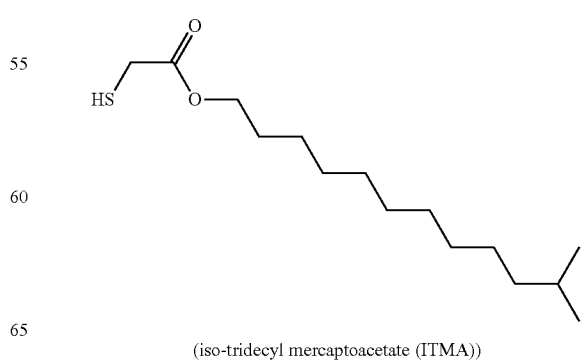

(iso-tridecyl mercaptoacetate (ITMA))

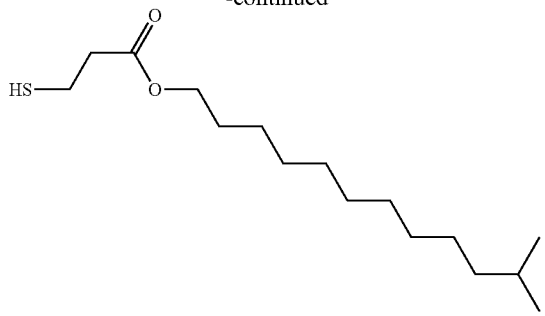

(iso-tridecyl mercaptoacetate (ITMP))

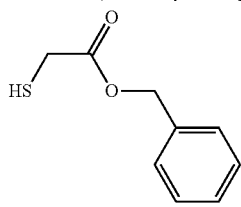

(Phenyl mercaptoacetate (PMA))

Semiconducting Light Emitting Nanoparticle

According to the present invention, the term "semiconductor" means a material that has electrical conductivity to a degree between that of a conductor (such as copper) and that of an insulator (such as glass) at room temperature. Preferably, a semiconductor is a material whose electrical conductivity increases with the temperature.

The term "nano" means the size in between 0.1 nm and 999 nm, preferably 1 nm to 150 nm, more preferably 3 nm to 50 nm.

Thus, according to the present invention, "semiconducting light emitting nanoparticle" is taken to mean that the light emitting material which size is in between 0.1 nm and 999 nm, preferably 1 nm to 150 nm, more preferably 3 nm to 50 nm, having electrical conductivity to a degree between that of a conductor (such as copper) and that of an insulator (such as glass) at room temperature, preferably, a semiconductor is a material whose electrical conductivity increases with the temperature, and the size is in between 0.1 nm and 999 nm, preferably 0.5 nm to 150 nm, more preferably 1 nm to 50 nm.

According to the present invention, the term "size" means the average diameter of the longest axis of the semiconducting nanosized light emitting particles.

The average diameter of the semiconducting nanosized light emitting particles is calculated based on 100 semiconducting light emitting nanoparticles in a TEM image created by a Tecnai G2 Spirit Twin T-12 Transmission Electron Microscope.

In a preferred embodiment of the present invention, the semiconducting light emitting nanoparticle of the present invention is a quantum sized material. Such as a quantum dot.

According the present invention, the shape of the quantum dot is not particularly limited. For examples, spherical shaped, elongated shaped, star shaped, polyhedron shaped, pyramidal shaped, tetrapod shaped, tetrahedron shaped, platelet shaped, cone shaped, and irregular shaped quantum dots can be used.

According to the present invention, the term "quantum sized" means the size of the semiconducting material itself without ligands or another surface modification, which can show the quantum confinement effect, like described in, for example, ISBN:978-3-662-44822-9.

In a preferred embodiment of the present invention, the nanoparticle comprising at least
i) the first semiconducting material;
ii) optionally at least one shell layer;
iii) the chemical compound represented by following chemical formula (I) in this sequence.

For example, CdS, CdSe, CdTe, ZnS, ZnSe, ZnSeS, ZnTe, ZnO, GaAs, GaP, GaSb, HgS, HgSe, HgSe, HgTe, InAs, InP, InPS, InPZnS, InPZn, InPZnSe, InCdP, InPCdS, InPCdSe, InGaP, InGaPZn, InSb, AlAs, AlP, AlSb, $Cu_2S$, $Cu_2Se$, CuInS2, $CuInSe_2$, $Cu_2(ZnSn)S_4$, $Cu_2(InGa)S_4$, $TiO_2$ alloys and a combination of any of these can be used as a core.

In a preferred embodiment of the present invention, the first semiconducting material comprises at least one element of group 13 elements or 12 elements of the periodic table and one element of group 16 elements of the periodic table, preferably said element of group 13 elements is selected from In, Ga, Al, Ti, said element of group 12 is Zn or Cd, and said element of group 15 elements is selected from P, As, Sb, more preferably said first semiconducting material is represented by following chemical formula (III), $$In_{(1-x-y)}Ga1.5_xZn_yP \quad (III)$$

wherein 0≤x<1, 0≤y<1, 0≤x+y<1, preferably said first semiconducting material is selected from the group consisting of InP, InP:Zn, InP:ZnS, InP:ZnSe, InP:ZnSSe, InP:Ga.

According to the present invention, a type of shape of the first semiconducting material of the semiconducting light emitting nanoparticle, and shape of the semiconducting light emitting nanoparticle to be synthesized are not particularly limited.

For examples, spherical shaped, elongated shaped, star shaped, polyhedron shaped, pyramidal shaped, tetrapod shaped, tetrahedron shaped, platelet shaped, cone shaped, and irregular shaped first semiconducting material and—or a semiconducting light emitting nanoparticle can be synthesized.

In some embodiments of the present invention, the average diameter of the first semiconducting materials in the range from 1.5 nm to 3.5 nm.

In some embodiments of the present invention, said semiconducting light emitting nanoparticle comprises at least one the shell layer comprises or a consisting of a $1^{st}$ element of group 12 of the periodic table and a $2^{nd}$ element of group 16 of the periodic table, preferably, the $1^{st}$ element is Zn, and the $2^{nd}$ element is S, Se, or Te.

In a preferred embodiment of the present invention, the shell layer is represented by following formula (II), $$ZnS_xSe_{(1-x-z)}Te_z, \quad (II)$$

wherein 0≤x≤1, 0≤z≤1, and x+z1, preferably, the shell layer is ZnSe, $ZnS_xSe_{(1-x)}$, $ZnSe_{(1-x)}Te_z$, ZnS, Zn, more preferably it is ZnSe or ZnS.

In some embodiments of the present invention, said shell layer is an alloyed shell layer or a graded shell layer, preferably said graded shell layer is $ZnS_xSe_y$, $ZnSe_yTe_z$, or $ZnS_xTe_z$, more preferably it is $ZnS_xSe_y$.

In some embodiments of the present invention, the semiconducting light emitting nanoparticle further comprises $2^{nd}$ shell layer onto said shell layer, preferably the $2^{nd}$ shell layer comprises or a consisting of a $3^{rd}$ element of group 12 of the periodic table and a $4^{th}$ element of group 16 of the periodic table, more preferably the $3^{rd}$ element is Zn, and the $4^{th}$ element is S, Se, or Te with the proviso that the $4^{th}$ element and the $2^{nd}$ element are not same.

In a preferred embodiment of the present invention, the $2^{nd}$ shell layer is represented by following formula (II'), $$ZnS_xSe_yTe_z, \quad (II')$$

wherein the formula (II'), 0≤x≤1, 0≤y≤1, 0≤z≤1, and x+y+z=1, preferably, the shell layer is ZnSe, $ZnS_xSe_y$, ZnSe$_y$Te$_z$, or ZnS$_x$Te$_z$ with the proviso that the shell layer and the 2$^{nd}$ shell layer is not the same.

In some embodiments of the present invention, said 2$^{nd}$ shell layer can be an alloyed shell layer.

In some embodiments of the present invention, the semiconducting light emitting nanoparticle can further comprise one or more additional shell layers onto the 2$^{nd}$ shell layer as a multishell.

According to the present invention, the term "multishell" stands for the stacked shell layers consisting of three or more shell layers.

For example, CdSe/CdS, CdSeS/CdZnS, CdSeS/CdS/ZnS, ZnSe/CdS, CdSe/ZnS, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS, InZnPS/ZnS, ZnS, InZnPS ZnSe, InZnPS/ZnSe/ZnS, ZnSe/CdS, ZnSe/ZnS or combination of any of these, can be used. Preferably, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS.

Additional Ligand

In some embodiments of the present invention, optionally, the semiconducting light emitting nanoparticle can comprise a different type of chemical compound as a ligand in addition to the chemical compound represented by the formula (I).

Thus, in some embodiments of the present invention, the outermost surface of the first semiconducting material or the shell layers of the semiconducting light emitting nanoparticle can be over coated with one or more of other compounds together with the chemical compound represented by the formula (I), if desired.

In case one or more of said another chemical compounds attached onto the first semiconducting material or the outer most surface of the shell layer(s) of the semiconducting light emitting nanoparticle, the amount of the chemical compound represented by the formula (I) is in the range from 1 wt. % to 99.9 wt % of the total ligands attached onto the outermost surface of the first semiconducting material or the shell layer(s), with preferably being of in the range from 10 wt % to 50 wt %, more preferably it is in the range from 15 wt. % to 40 wt. %.

In some embodiment of the present invention, the composition can further comprise one or more of additives.

Preferably, said additive is selected from the group consisting of another ligand.

Without wishing to be bound by theory it is believed that such a surface ligands may lead to disperse the nanosized fluorescent material in a solvent more easily.

The surface ligands in common use include phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), Octadecylphosphonic acid (ODPA), and Hexylphosphonic acid (HPA); amines such as Oleylamine, Dedecyl amine (DDA), Tetradecyl amine (TDA), Hexadecyl amine (HDA), and Octadecyl amine (ODA), Oleylamine (OLA), 1-Octadecene (ODE), thiols such as hexadecane thiol and hexane thiol; mercapto carboxylic acids such as mercapto propionic acid and mercaptoundecanoicacid; carboxylic acids such as oleic acid, stearic acid, myristic acid; acetic acid and a combination of any of these. And also. Polyethylenimine (PEI) also can be used preferably.

Examples of surface ligands have been described in, for example, the laid-open international patent application No. WO 2012/059931A.

Composition

In another aspect, the present invention also relates to a composition comprising, essentially consisting of, or consisting of, at least a) one semiconducting light emitting nanoparticle comprising a core, optionally at least one shell layer,
b) one chemical compound represented by following chemical formula (I)

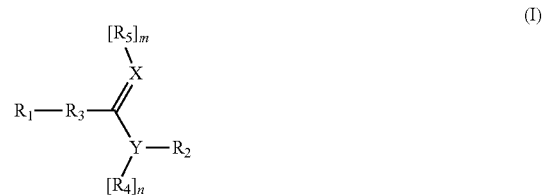

(I)

wherein

X and Y are each independently or dependently of each other, O, S, P or N, preferably O or N;

n is 0 if Y is O or S, n is 1 if Y is N or P, preferably n is 0;

m is 0 if X is O or S, m is 1 if Y is N or P, preferably n is 0;

R$_1$ is an attaching group, preferably said attaching group comprises at least one element selected from S, Se, O, P or N, more preferably said attaching group comprises one or two S atoms, even more preferably said attaching group is

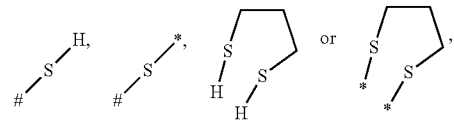

furthermore preferably

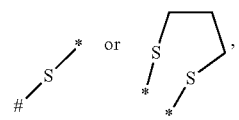

where "#" represents the connecting point to group Y, and "*" represents the connecting point to the surface of the first semiconducting material or the outermost surface of the shell layer of the semiconducting light emitting nanoparticle;

In case of the nanoparticle comprises more than two shell layers, "*" represents the connecting point to the outermost surface of the shell layers of the semiconducting light emitting nanoparticle;

R$_2$ is selected from one or more member of the group consisting of a linear alkyl group or alkoxyl group having 1 to 40 carbon atoms, preferably 1 to 25 carbon atoms, more preferably 1 to 15 carbon atoms, a branched alkyl group or alkoxyl group having 3 to 40 carbon atoms, preferably 3 to 25 carbon atoms, more preferably 3 to 15 carbon atoms, a cycloalkane group having 3 to 40 carbon atoms, preferably 3 to 25 carbon atoms, more preferably 3 to 15 carbon atoms, an alkenyl group having 2 to 40 carbon atoms, preferably 2 to 25 carbon atoms, an aryl group having 3 to 40 carbon atoms, preferably 3 to 25 carbon atoms, a hetero aryl group having 3 to 40 carbon atoms, preferably 3 to 25 carbon atoms, and an aralkyl group having 4 to 40 carbon atoms, preferably 4 to 25 carbon atoms, which may in each case be substituted by one or more radicals R$^a$, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=NR$^a$, SO, SO$_2$, NR$^a$, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$;

R$^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents R$^a$ here may also form a mono- or polycyclic, aliphatic, aromatic or heteroaromatic ring system with one another;

R$_3$ is selected from one or more member of the group consisting of a linear alkylene group or alkoxylene group having 1 to 25 carbon atoms, preferably 1 to 15 carbon atoms, more preferably 1 to 10 carbon atoms, even more preferably 1 to 5 carbon atoms, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=NR$^a$, SO, SO$_2$, NR$^a$, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$, preferably none of non-adjacent CH$_2$ groups are substituted, R$_4$ is selected from one or more member of the group consisting of H atom, D atom, or R$_2$, R$_5$ is selected from one or more member of the group consisting of H atom, D atom, or R$_2$.

and c) another compound.

In more details of the chemical compound represented by the chemical formula (I) is described in the section of "chemical compound" above.

In another aspect, the present invention relates to a composition comprising, essentially consisting of, or consisting, at least A) one semiconducting light emitting nanoparticle according to the present invention, and B) another compound.

In some embodiments of the present invention, the composition comprises a plurality of semiconducting light emitting nanoparticles.

In some embodiments of the present invention, the total amount of the semiconducting light emitting nanoparticle is in the range from 0.1 wt. % to 90 wt. % based on the total amount of the composition, preferably from 5 wt. % to 70 wt. %, more preferably from 20 wt. % to 50 wt. %.

In some embodiments of the present invention, wherein the total amount of the chemical compound represented by following chemical formula (I) is in the range from 0.001 wt. % to 50 wt. % based on the total amount of the composition, preferably from 0.005 wt. % to 30 wt. %, more preferably from 0.01 wt. % to 15 wt. %.

In some embodiments of the present invention, said another material is selected from one or more member of the group consisting of a solvent, organic light emitting material, inorganic light emitting material, charge transporting material, scattering particle, host material, nanosized plasmonic particle, photo initiator, and a matrix material.

For example, said inorganic fluorescent material can be selected from one or more member of the group consisting of sulfides, thiogallates, nitrides, oxynitrides, silicate, aluminates, apatites, borates, oxides, phosphates, halophosphates, sulfates, tungstenates, tantalates, vanadates, molybdates, niobates, titanates, germinates, halides-based phosphors, and a combination of any of these.

Such suitable inorganic fluorescent materials described above can be well known phosphors including nanosized phosphors, quantum sized materials like mentioned in the phosphor handbook, 2$^{nd}$ edition (CRC Press, 2006), pp. 155-pp. 338 (W. M. Yen, S. Shionoya and H. Yamamoto), WO2011/147517A, WO2012/034625A, and WO2010/095140A.

According to the present invention, as said organic light emitting materials, charge transporting materials, any type of publicly known materials can be used preferably. For example, well known organic fluorescent materials, organic host materials, organic dyes, organic electron transporting materials, organic metal complexes, and organic hole transporting materials.

For examples of scattering particles, small particles of inorganic oxides such as SiO$_2$, SnO$_2$, CuO, CoO, Al$_2$O$_3$ TiO$_2$, Fe$_2$O$_3$, Y$_2$O$_3$, ZnO, MgO; organic particles such as polymerized polystyrene, polymerized PMMA; inorganic hollow oxides such as hollow silica or a combination of any of these; can be used preferably.

Matrix Material

According to the present invention, a wide variety of publicly known transparent polymers suitable for optical devices can be used preferably as a matrix material.

According to the present invention, the term "transparent" means at least around 60% of incident light transmit at the thickness used in an optical medium and at a wavelength or a range of wavelength used during operation of an optical medium. Preferably, it is over 70%, more preferably, over 75%, the most preferably, it is over 80%.

In a preferred embodiment of the present invention, any type of publicly known transparent polymers, described in for example, WO 2016/134820A can be used.

According to the present invention the term "polymer" means a material having a repeating unit and having the weight average molecular weight (Mw) 1000 g/mol, or more.

The molecular weight M$_w$ is determined by means of GPC (=gel permeation chromatography) against an internal polystyrene standard.

In some embodiments of the present invention, the glass transition temperature (Tg) of the transparent polymer is 70° C. or more and 250° C. or less.

Tg is measured based on changes in the heat capacity observed in Differential scanning colorimetry like described in http://pslc.ws/macrog/dsc.htm; Rickey J Seyler, Assignment of the Glass Transition, ASTM publication code number (PCN) 04-012490-50.

For example, as the transparent polymer for the transparent matrix material, poly(meth)acrylates, epoxys, polyurethanes, polysiloxanes, can be used preferably.

In a preferred embodiment of the present invention, the weight average molecular weight (Mw) of the polymer as the transparent matrix material is in the range from 1,000 to 300,000 g/mol, more preferably it is from 10,000 to 250,000 g/mol.

Formulation

In another aspect, the present invention relates to a formulation comprising, essentially consisting of, or consisting of at least one semiconducting light emitting nanoparticle, and at least one solvent, preferably said solvent is an organic solvent, more preferably selected from one or more members of the group consisting of cyclohexylbenzene, 3-phenoxy toluene, n-octyl benzene, butyl benzoate, 1-octanol, 3,4-dimethylanisole, 2-phenoxyethanol, methyl isovalerate, dimethyl sulfoxide, 2-phenoxypropanol.

Preferably, said formulation comprises a plurality of semiconducting light emitting nanoparticles.

In another aspect, the present invention also relates to a formulation comprising, essentially consisting of, or consisting of the composition, and at least one solvent, preferably it is an organic solvent, more preferably selected from one or more members of the group consisting of aromatic, halogenated and aliphatic hydrocarbon solvents, more preferably selected from one or more members of the group consisting of toluene, xylene, ethers, tetrahydrofuran, chloroform, dichloromethane and heptane, purified water, ester acetates, alcohols, sulfoxides, formamides, nitrides, ketones.

The amount of the solvent in the formulation can be freely controlled according to the method of coating the composition. For example, if the composition is to be spray-coated, it can contain the solvent in an amount of 90 wt. % or more. Further, if a slit-coating method, which is often adopted in coating a large substrate, is to be carried out, the content of the solvent is normally 60 wt. % or more, preferably 70 wt. % or more.

In some embodiments of the present invention, the formulation comprises a plural of the semiconducting light emitting nanoparticles and/or a plural of the semiconducting materials.

In some embodiments, the total amount of the chemical compound represented by following chemical formula (I) is in the range from 0.001 wt. % to 50 wt. % based on the total amount of the formulation, preferably from 0.005 wt. % to 30 wt. %, more preferably from 0.01 wt. % to 15 wt. %.

In some embodiments, the total amount of the nanoparticle is in the range from 0.01 wt. % to 90 wt. % based on the total amount of the formulation, preferably from 0.1 wt. % to 70 wt. %, more preferably from 1 wt. % to 50 wt. %.

Use

In another aspect, the present invention relates to use of the semiconducting light emitting nanoparticle, the composition, or the formulation, in an electronic device, optical device, in a biomedical device or for fabricating an electronic device, optical device or a biomedical device.

Optical Medium

In another aspect, the present invention further relates to an optical medium comprising at least one semiconducting light emitting nanoparticle or the composition.

In some embodiments of the present invention, the optical medium can be an optical sheet, for example, a color filter, color conversion film, remote phosphor tape, or another film or filter.

According to the present invention, the term "sheet" includes film and/or layer like structured mediums.

In some embodiments of the present invention, the optical medium comprises an anode and a cathode, and at least one organic layer comprising at least one semiconducting light emitting nanoparticle or the composition of the present invention, preferably said one organic layer is a light emission layer, more preferably the medium further comprises one or more additional layers selected from the group consisting of hole injection layers, hole transporting layers, electron blocking layers, hole blocking layers, electron blocking layers, and electron injection layers.

According to the present invention, any kinds of publicly available inorganic, and/or organic materials for hole injection layers, hole transporting layers, electron blocking layers, light emission layers, hole blocking layers, electron blocking layers, and electron injection layers can be used preferably, like as described in WO 2018/024719 A1, US2016/233444 A2, U.S. Pat. No. 7,754,841 B, WO 2004/037887 and WO 2010/097155.

In a preferable embodiment of the present invention, the optical medium comprises a plurality of the semiconducting light emitting nanoparticles.

Preferably, the anode and the cathode of the optical medium sandwich the organic layer.

More preferably said additional layers are also sandwiched by the anode and the cathode.

In some embodiments of the present invention, the organic layer comprises at least one semiconducting light emitting nanoparticle of the present invention, and a host material, preferably the host material is an organic host material.

In a preferable embodiment of the present invention, the optical medium comprises a plurality of the semiconducting light emitting nanoparticles.

Optical Device

In another aspect, the invention further relates to an optical device comprising at least one optical medium of the present invention.

In some embodiments of the present invention, the optical device can be a liquid crystal display device (LCD), Organic Light Emitting Diode (OLED), backlight unit for an optical display, Light Emitting Diode device (LED), Micro Electro Mechanical Systems (here in after "MEMS"), electro wetting display, or an electrophoretic display, a lighting device, and/or a solar cell.

Technical Effects

The present invention provides one or more of following technical effects;

improvement of quantum yield of nanoparticle, higher device efficiency, lowering trap emission of nanoparticle, optimizing a surface condition of shell part of nanoparticle, reducing lattice defects of a shell layer of nanoparticle, reducing/preventing formation of dangling bonds of shell layer, better thermal stability, improved oxidation stability, improved stability to a radical substances, improved stability during a long term storage without causing a significant QY drop, better chemical stability, optimizing fabrication process of nanoparticle, providing new fabrication process for reducing lattice defects of a shell layer, environmentally more friendly and safer fabrication process.

The working examples 1-6 below provide descriptions of the present invention, as well as an in-detail description of their fabrication.

WORKING EXAMPLES

Comparative Example 1

Quantum Dots in Toluene with Ligands of Dodecanethiol, stearic acid, myristic acid, and palmitic acid Red InP based Quantum Dots (QDs) with Ligands of Dodecanethiol, stearic acid, myristic acid, and palmitic acid in toluene are prepared like described in U.S. Pat. No. 7,588,828 B.

QDs are then dissolved in dry toluene at a concentration of 0.08 mg/mL and are measured in Hamamatsu Quantaurus for initial Quantum Yield (hereafter initial QY).

Afterwards 100 mg of QDs are dissolved in 2 mL of dried toluene and mixed with 3 mg of photo-initiator Irgacure® TPO and stirred at room temperature under Argon while exposing to a light source with 365 nm for 60 min. The samples are taken. The samples are then diluted to 0.08 mg/mL. And then, Quantum Yield of the samples are measured by Hamamatsu Quantaurus.

The initial QY of each sample is set to 100% by using the following formula.

Normalized initial $QY(100\%)$=initial $QY$ of each sample*α

Normalized QY is calculated based on the following formula.

$$\text{Normalized } QY = (QY*\alpha/\text{Initial } QY)*100 \qquad 5$$

Table 4 shows the results of the measurements.

TABLE 4

| Sample | 1 | 2 | 3 | 4 | 5 | 6 | 7 | 8 | 9 |
|---|---|---|---|---|---|---|---|---|---|
| Normalized Initial QY (%) | 100 | 100 | 100 | 100 | 100 | 100 | 100 | 100 | 100 |
| Normalized QY at 1 hour (%) | 49 | 60 | 62 | 63 | 50 | 47 | 60 | 49 | 52 |

Working Example 1

Quantum Dots in Toluene with Chemical Compound iso-octyl mercaptoacetate (IOMA)

Red InP based Quantum Dots (QDs) with Ligands of Dodecanethiol, stearic acid, myristic acid, and palmitic acid in toluene are prepared like described in U.S. Pat. No. 7,588,828 B.

Ligand Exchange 5 mL of QDs solution (50 mg/mL in Toluene) are mixed with 0.098 g IOMA (Bruno Bock iso-Octyl Thioglycolate, dist. 40286) and stirred overnight at 50° C. under Argon. The mixture is transferred into a centrifuge vial and added 5 mL dried Methanol. The mixture is centrifuged at 4000 rpm 5 min under Argon. Afterwards the colorless supernatant is removed, and the red precipitation is suspended in 5 mL dried Toluene so that QDs are dissolved in dry toluene at a concentration of 0.08 mg/mL.

Then it is measured in Hamamatsu Quantaurus for initial Quantum Yield (hereafter initial QY).

Afterwards 100 mg of QDs are dissolved in 2 mL of dried toluene and mixed with 3 mg of photo-initiator Irgacure® TPO and stirred at room temperature under Argon while exposing to a light source with 365 nm for 60 min. The samples are taken. The samples are then diluted to 0.08 mg/mL. And then, Quantum Yield of the samples are measured by Hamamatsu Quantaurus. Table 5 shows the results of the measurement.

TABLE 5

| Sample | 1 | 2 | 3 | 4 | 5 |
|---|---|---|---|---|---|
| Normalized Initial QY (%) | 100 | 100 | 100 | 100 | 100 |
| Normalized QY at 1 hour (%) | 98 | 96 | 93 | 92 | 94 |

Working Example 2

Quantum Dots in Toluene with Chemical Compound iso-octyl mercaptopropionate (IOMP)

Quantum dots in toluene with chemical compound IOMP are prepared in the same manner as described in working example 1 except for that the IOMP is used instead of IOMA.

Table 6 shows the results of the QY measurements.

TABLE 6

| Sample | 1 | 2 | 3 |
|---|---|---|---|
| Normalized Initial QY (%) | 100 | 100 | 100 |
| Normalized QY at 1 hour (%) | 75 | 81 | 90 |

Working Example 3

Quantum Dots in Toluene with Chemical Compound iso-tridectyl mercaptopropionate (ITMP)

Quantum dots in toluene with chemical compound ITMP are prepared in the same manner as described in working example 1 except for that the ITMP is used instead of IOMA.

Table 7 shows the results of the QY measurements.

TABLE 7

| Sample | 1 | 2 | 3 |
|---|---|---|---|
| Normalized Initial QY (%) | 100 | 100 | 100 |
| Normalized QY at 1 hour (%) | 80 | 81 | 82 |

Working Example 4

Quantum Dots in Toluene with Chemical Compound iso-tridectyl mercaptoacetate (ITMA)

Quantum dots in toluene with chemical compound ITMA are prepared in the same manner as described in working example 1 except for that the ITMA is used instead of IOMA.

Table 8 shows the results of the QY measurements.

TABLE 8

| Sample | 1 | 2 | 3 |
|---|---|---|---|
| Normalized Initial QY (%) | 100 | 100 | 100 |
| Normalized QY at 1 hour (%) | 96 | 94 | 96 |

Working Example 5

Quantum Dots in Toluene with Chemical Compound phenyl mercaptoacetate (PMA)

Quantum dots in toluene with chemical compound PMA are prepared in the same manner as described in working example 1 except for that the PMA is used instead of IOMA. Then sample is taken for a QY measurements.

Working Example 6

QY Measurements

In the QY measurement in the working example 6, a sample from comparative example 1, a sample from working example 1, and a sample from working example 5 are measured to compere the effect of the invention.

In this working example, quantum yields are measured by using Hamamatsu Quantaurus without any normalization as described in the comparative example 1. Therefore, in FIG. 1, the term "quantum yield (or QY)" means absolute quantum yield.

FIG. 1 shows the results of the QY measurements.

The invention claimed is:

1. A semiconducting light emitting nanoparticle comprising at least
   i) a first semiconducting material;
   ii) optionally at least one shell layer;
   iii) a chemical compound of formula (I)

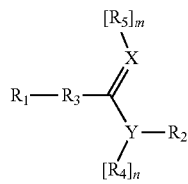

(I)

wherein
X and Y are each independently of each other, O, S, P or N;
n is 0 if Y is O or S, or n is 1 if Y is N or P;
m is 0 if X is O or S, or m is 1 if Y is N or P;
$R_1$ is an attaching group,
$R_2$ is a linear alkyl group or alkoxyl group having 1 to 40 carbon atoms, a branched alkyl group or alkoxyl group having 3 to 40 carbon atoms, a cycloalkane group having 3 to 40 carbon atoms, an alkenyl group having 2 to 40 carbon atoms, an aryl group having 3 to 40 carbon atoms, a hetero aryl group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=NR^a$, SO, $SO_2$, $NR^a$, or $CONR^a$ and where one or more H atoms may be replaced by F, Cl, Br, I, CN or $NO_2$, or an aromatic or heteroaromatic ring system having 5 to 60 aromatic ring atoms, which may be substituted by one or more radicals $R^a$, $R^a$ is at each occurrence, identically or different D, or an alkyl group having 1 to 20 carbon atoms, or a cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, or I; and wherein two or more adjacent substituents $R^a$ here may form a mono- or polycyclic, aliphatic, aromatic or heteroaromatic ring system with one another;

$R_3$ is a divalent bond,
$R_4$ is an H atom, D atom, or $R_2$,
$R_5$ is an H atom, D atom, or $R_2$.

2. The nanoparticle of claim 1, comprising at least
   i) the first semiconducting material;
   ii) optionally at least one shell layer;
   iii) the chemical compound represented by following chemical formula (I) in this sequence.

3. The nanoparticle of claim 1, comprising at least one shell layer represented by formula (II)

$$ZnS_xSe_{(1-x-z)}Te_z,— \quad (II)$$

wherein $0 \leq x \leq 1$, $0 \leq z \leq 1$.

4. The nanoparticle of claim 1, wherein the first semiconducting material comprises at least one element of group 13 elements or group 12 elements of the periodic table and one element of group 16 elements of the periodic table.

5. A composition comprising at least
   a) one semiconducting light emitting nanoparticle comprising a core, optionally at least one shell layer,
   b) one chemical compound of formula (I)

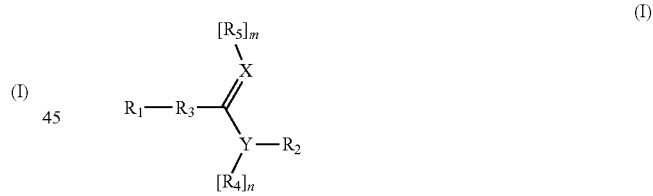

(I)

wherein
X and Y are each independently or dependently of each other, 0, S, P or N;
n is 0 if Y is O or S, n is 1 if Y is N or P;
m is 0 if X is O or S, m is 1 if Y is N or P;
$R_1$ is an attaching group;
$R_2$ is a linear alkyl group or alkoxyl group having 1 to 40 carbon atoms, a branched alkyl group or alkoxyl group having 3 to 40 carbon atoms, a cycloalkane group having 3 to 40 carbon atoms, an alkenyl group having 2 to 40 carbon atoms, an aryl group having 3 to 40 carbon atoms, a hetero aryl group having 3 to 40 carbon atoms, or an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=NR^a$, SO, $SO_2$, $NR^a$, or $CONR^a$ and where one or more H atoms may be replaced by F, Cl, Br, I, CN or NO$_2$, or an aromatic or heteroaromatic ring system having 5 to 60 aromatic ring atoms, which may be substituted by one or more radicals R$^a$, R$^a$ is at each occurrence, identically or different D, or an alkyl group having 1 to 20 carbon atoms, or a cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, or I; and wherein two or more adjacent substituents R$^a$ here may form a mono- or polycyclic, aliphatic, aromatic or heteroaromatic ring system with one another;

R$_3$ is of a linear alkylene group or alkoxylene group having 1 to 25 carbon atoms, where one or more non-adjacent CH$_2$ groups may be replaced by R$^a$C=CR$^a$, C=C, Si(R$^a$)$_2$, Ge(R$^a$)$_2$, Sn(R$^a$)$_2$, C=O, C=S, C=NR$^a$, SO, SO$_2$, NR$^a$, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$, R$_4$ is an H atom, D atom, or R$_2$,
R$_5$ is an H atom, D atom or R$_2$,
and
c) another compound.

6. A composition comprising at least
A) one semiconducting light emitting nanoparticle according to claim 1, and
B) another compound.

7. The composition of claim 6, wherein the composition comprises a plurality of semiconducting light emitting nanoparticles.

8. The composition according to claim 6, wherein said another compound is an organic light emitting material, inorganic light emitting material, charge transporting material, scattering particle, host material, nanosized plasmonic particle, photo initiator or a matrix material.

9. A formulation comprising at least one semiconducting light emitting nanoparticle according to claim 1, and
at least one solvent.

10. The formulation of claim 9, wherein the total amount of the compound of formula (I) is 0.001 wt. % to 50 wt. % based on the total amount of the formulation.

11. The formulation according to claim 9, wherein the total amount of the nanoparticle is 0.01 wt. % to 90 wt. % based on the total amount of the formulation.

12. An optical device or biomedical device comprising the semiconducting light emitting nanoparticle according to claim 1.

13. An optical medium comprising at least one semiconducting light emitting nanoparticle according to claim 1.

14. An optical medium, comprising an anode and a cathode, and at least one organic layer comprising the at least one semiconducting light emitting nanoparticle according to claim 1, and optionally the medium further comprises one or more layers selected from the group consisting of hole injection layers, hole transporting layers, electron blocking layers, hole blocking layers, electron blocking layers, and electron injection layers.

15. The optical medium of claim 14, wherein the organic layer comprises the at least one semiconducting light emitting nanoparticle and a host material.

16. An optical device comprising at least said optical medium according to claim 13.

17. The nanoparticle of claim 1, wherein
R$_1$ is an attaching group of one of the following formulae

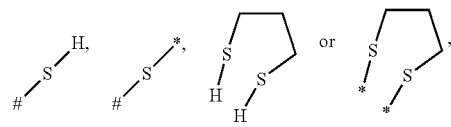

where "#" represents the connecting point to group R$_3$, and "*" represents the connecting point to the surface of the core or the outermost surface of the shell layer of the semiconducting light emitting nanoparticle; and R$_3$ is a linear alkylene group or alkoxylene group having 1 to 25 carbon atoms, where one or more non-adjacent CH$_2$ groups may be replaced by R$^a$C=CR$^a$, C=C, Si(R$^a$)$_2$, Ge(R$^a$)$_2$, Sn(R$^a$)$_2$, C=O, C=S, C=NR$^a$, SO, SO$_2$, NR$^a$, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$.

18. The composition of claim 5, wherein
R$_1$ is an attaching croup of one of the following formulae

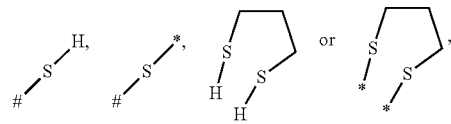

where "#" represents the connecting point to group Y, and "*" represents the connecting point to the surface of the core or the outermost surface of the shell layer of the semiconducting light emitting nanoparticle; and R$_3$ is a linear alkylene group or alkoxylene group having 1 to 25 carbon atoms, where one or more non-adjacent CH$_2$ groups may be replaced by R$^a$C=CR$^a$, C=C, Si(R$^a$)$_2$, Ge(R$^a$)$_2$, Sn(R$^a$)$_2$, C=O, C=S, C=NR$^a$, SO, SO$_2$, NR$^a$, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$.

19. The nanoparticle of claim 1, wherein the first semiconducting material is of formula (III),

$$In_{(1-x-y)}Ga1.5_xZn_yP \quad (III)$$

wherein 0≤x≤1, 0≤x+y<1,
or
is selected from the group consisting of InP, InP:Zn, InP:ZnS, InP:ZnSe, InP:ZnSSe and InP:Ga.

20. A semiconducting light emitting nanoparticle comprising at least
i) a first semiconducting material;
ii) optionally at least one shell layer;
iii) a chemical compound of formula (I)

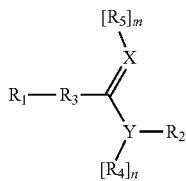

(I)

wherein

X and Y are each independently of each other, O, S, P or N;

n is 0 if Y is O or S, or n is 1 if Y is N or P;

m is 0 if X is O or S, or m is 1 if Y is N or P;

$R_1$ is an attaching group, $R_2$ is a branched alkyl group or alkoxyl group having 3 to 40 carbon atoms, a cycloalkane group having 3 to 40 carbon atoms, an aryl group having 3 to 40 carbon atoms, a hetero aryl group having 3 to 40 carbon atoms, or an aralkyl group having 4 to 40 carbon atoms, which may in each case be substituted by one or more radicals $R^a$, where one or more non-adjacent $CH_2$ groups may be replaced by $R^aC=CR^a$, $C=C$, $Si(R^a)_2$, $Ge(R^a)_2$, $Sn(R^a)_2$, $C=O$, $C=S$, $C=NR^a$, SO, $SO_2$, $NR^a$, or $CONR^a$ and where one or more H atoms may be replaced by F, Cl, Br, I, CN or $NO_2$, or an aromatic or heteroaromatic ring system having 5 to 60 aromatic ring atoms, which may be substituted by one or more radicals $R^a$, $R^a$ is at each occurrence, identically or differently D, or an alkyl group having 1 to 20 carbon atoms, or a cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, or I; and wherein two or more adjacent substituents $R^a$ here may form a mono- or polycyclic, aliphatic, aromatic or heteroaromatic ring system with one another;

$R_3$ is a divalent bond, $R_4$ is an H atom, D atom, or $R_2$, $R_5$ is an H atom, D atom, or $R_2$.

* * * * *